(12) United States Patent
Osada et al.

(10) Patent No.: US 7,849,815 B2
(45) Date of Patent: Dec. 14, 2010

(54) PLASMA PROCESSING APPARATUS

(75) Inventors: Tomoaki Osada, Tokyo (JP); Yoshikazu Nozaki, Tokyo (JP)

(73) Assignee: Canon Anelva Corporation, Kanagawa (JP)

( * ) Notice: Subject to any disclaimer, the term of this patent is extended or adjusted under 35 U.S.C. 154(b) by 101 days.

(21) Appl. No.: 12/254,627

(22) Filed: Oct. 20, 2008

(65) Prior Publication Data
US 2009/0044910 A1    Feb. 19, 2009

Related U.S. Application Data

(63) Continuation of application No. 10/704,884, filed on Nov. 10, 2003, now abandoned.

(30) Foreign Application Priority Data

Nov. 13, 2002    (JP) ............................. 2002-330075

(51) Int. Cl.
*C23C 16/00*    (2006.01)
*H01L 21/302*    (2006.01)

(52) U.S. Cl. ...................... 118/723 E; 156/345.45; 156/345.47

(58) Field of Classification Search .............. 156/345.45–345.49; 118/723 E
See application file for complete search history.

(56) References Cited

U.S. PATENT DOCUMENTS

| 4,950,376 | A | 8/1990 | Hayashi et al. | ........ 204/192.32 |
| 5,044,311 | A | 9/1991 | Mase et al. | ............. 118/723 E |
| 5,534,751 | A | 7/1996 | Lenz et al. | ............ 315/111.71 |
| 5,571,366 | A | 11/1996 | Ishii et al. | .............. 156/345.26 |
| 5,891,350 | A | 4/1999 | Shan et al. | ..................... 216/71 |
| 6,051,100 | A | 4/2000 | Walko, II | ................ 156/345.47 |
| 6,178,919 | B1 | 1/2001 | Li et al. | .................... 118/723 E |
| 6,544,380 | B2 | 4/2003 | Tomoyasu et al. | ..... 156/345.51 |
| 6,673,196 | B1 | 1/2004 | Oyabu | .................... 156/345.31 |
| 2004/0025788 | A1 | 2/2004 | Ogasawara et al. | ......... 118/715 |

FOREIGN PATENT DOCUMENTS

| JP | 05-251394 | 9/1993 |
| JP | 09-055374 | 2/1997 |
| JP | 2002-151473 | 5/2002 |
| WO | 0227755 | 4/2002 |

OTHER PUBLICATIONS

Korean language office action dated Aug. 8, 2005 and its English language translation for corresponding Korean Application 1020030080252.
Korean language office action dated Feb. 7, 2006 and its English language translation for corresponding Korean application 1020030080252.
Chinese language office action dated Oct. 31, 2005 and its English language translation for corresponding Chinese application 200310114387.5.

*Primary Examiner*—Sylvia R. MacArthur
(74) *Attorney, Agent, or Firm*—DLA Piper LLP (US)

(57) ABSTRACT

This application discloses a practical plasma processing apparatus capable of plasma confinement without plasma-density non-uniformity and electric power loss. The apparatus comprises a plasma shield that surrounds a plasma generation region to prevent plasma from diffusing. The shield has at least one opening. The apparatus comprises a diffusion prevention electrode for preventing the plasma from diffusing through the opening of the plasma shield. The surface of the plasma shield exposed to the plasma is made of insulator. The diffusion prevention electrode is located where electrons diffusing toward the opening or having diffused through the opening from the plasma flow into itself.

10 Claims, 4 Drawing Sheets

(1)　　　　　　(2)　　　　　　(3)

PLASMA PROCESSING APPARATUS

CROSS-REFERENCE TO RELATED APPLICATIONS

This application is a continuation of U.S. application Ser. No. 10/704,884, filed on Nov. 10, 2002, and claims the benefit of priority under 35 USC 119 of Japanese application no. 2002-330075, filed on Nov. 13, 2002, which are incorporated herein by reference.

BACKGROUND OF THE INVENTION

1. Field of the Invention

This invention relates to an apparatus for carrying out a process by plasma onto a substrate.

2. Description of the Related Art

Processes by plasma onto substrates are widely carried out in fields such as manufactures of semiconductor devices and liquid crystal displays. In forming a micro-circuit onto a substrate, for example, the plasma etching is carried out utilizing a resist pattern on the substrate as a mask. In preparing a conductor film or insulator film, the method of plasma-enhanced chemical vapor deposition (CVD), which utilizes a gas-phase reaction in plasma, has been practical. An apparatus for such a process generates plasma by an RF discharge or dc dipolar discharge in a process chamber, and carries out the process by function of the plasma onto a substrate placed in the process chamber.

Plasma processing apparatuses are required to increase plasma density for enhancing productivity by reducing process time. For increasing plasma density it is effective to confine plasma in a region, preventing the plasma from diffusing.

Employment of a discharge shield is a way to confine plasma. The discharge shield is a grounded metallic member surrounding a region where plasma is generated. Because no electric field is applied outside the discharge shield, the plasma is confined inside the shield. However, the discharge shield would bear the problem that the plasma-density distribution lacks uniformity because charged particles of the plasma flow into the shield, resulting in that plasma density decreases near the shield. In addition, if the current flowing to the ground via the shield does not contribute to the plasma generation for a process, it means loss of energy, i.e., decrease of electric power efficiency.

As a method to confine plasma without lack of plasma-density uniformity and loss of electric power, it is known to cover the surface of a shield exposed to plasma with an insulation layer. As well known, when a surface insulation layer covering a grounded metallic body is made contact onto plasma, the surface of the layer takes so called insulation potential, or sometimes called floating potential. Because of high mobility of electrons compared to ions, the insulation potential is negative in the range of several volts to several tens volts. Because essentially no charged particles flows into the surface being the insulation potential, there is no decrease of plasma-density and no loss of electric power.

However, it is impractical to completely surround plasma-generation region by a shield. In almost all cases, an opening is required at a shield. For example, an opening is required in case a plasma generation region is pumped, a gas is introduced to the plasma generation region, or a substrate is transferred to a position adjacent to the plasma. In such a case, even if the surface of a shield is made of insulator for confining the plasma inside, the plasma easily performs bipolar diffusion through the opening. Concretely, high-mobility electrons diffuse initially through the opening. Then, following them, ions diffuse to maintain electrical neutrality. As a result, the plasma diffuse to the outside through the opening. Therefore, plasma confinement without the plasma-density non-uniformity and the electric power loss is practically difficult.

SUMMARY OF THE INVENTION

This invention is to solve the above-described problems, and presents a practical plasma processing apparatus capable of plasma confinement without the plasma-density non-uniformity and the electric power loss. Concretely, the plasma processing apparatus of the invention comprises a plasma shield that surrounds a plasma generation region to prevent plasma from diffusing. The shield has at least one opening. The apparatus comprises a diffusion prevention electrode for preventing the plasma from diffusing through the opening of the plasma shield. The surface of the plasma shield exposed to the plasma is made of insulator. The diffusion prevention electrode is located where electrons diffusing toward the opening or having diffused through the opening from the plasma flow into itself.

DETAILED DESCRIPTION OF THE PREFERRED EMBODIMENTS

Figure 1:
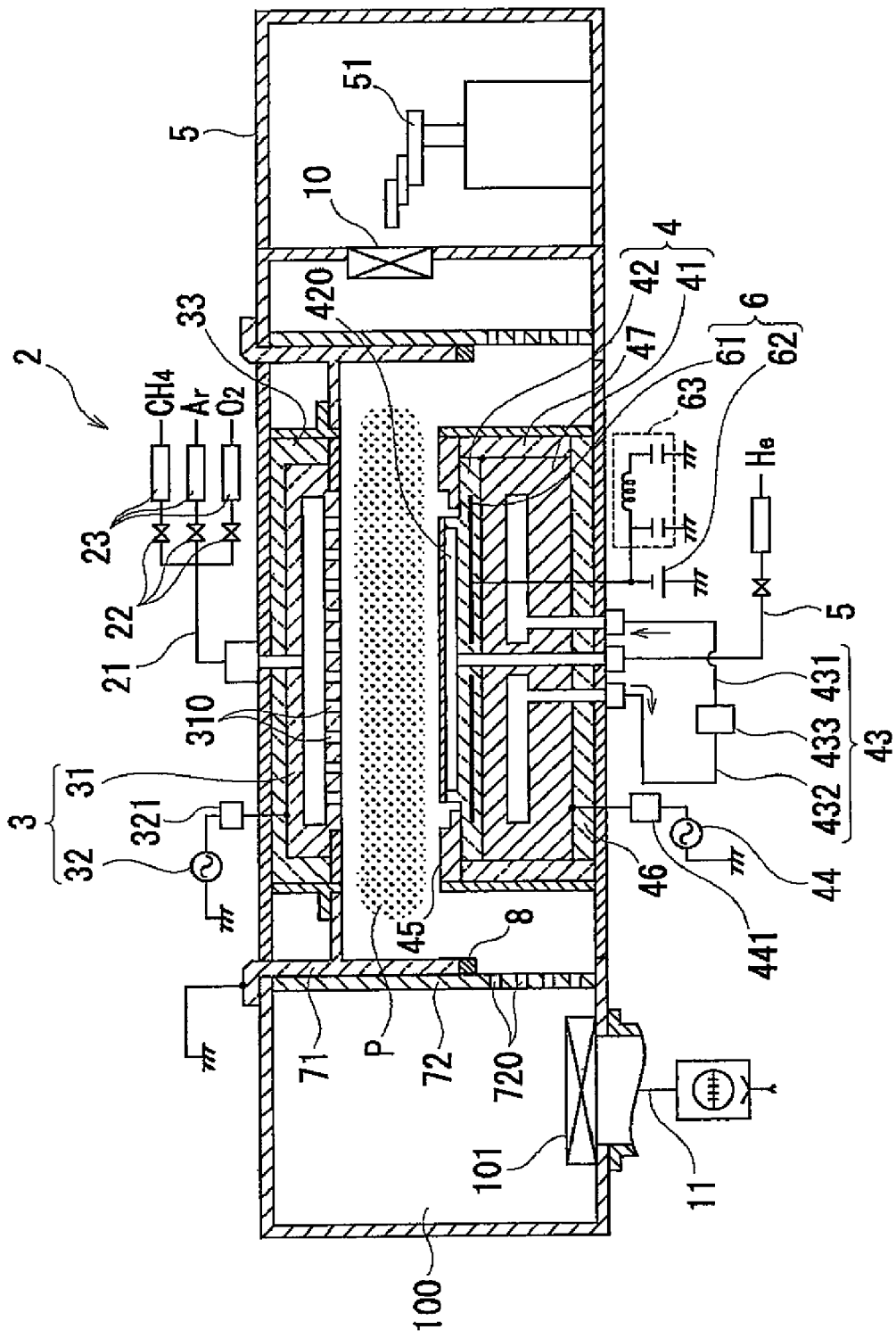
FIG. 1 is the schematic front cross-sectional view of the plasma processing apparatus as the first embodiment of the invention.

The preferred embodiments of this invention will be described as follows. FIG. 1 is the schematic front cross-sectional view of the plasma processing apparatus as the first embodiment of the invention. The apparatus shown in FIG. 1 is for the plasma etching.

Concretely, the apparatus comprises a process chamber 1 in which the plasma etching is carried out onto a substrate 9. The process chamber 1 is an airtight vacuum chamber. The process chamber 1 is electrically grounded. A transfer chamber 5 is air-tightly connected with the process chamber 1, interposing a gate valve 10. A transfer robot 51 is provided in the transfer chamber 5. A load-lock chamber (not shown) is connected with the transfer chamber 5, interposing another gate valve (not shown). The substrate 9 is transferred from the atmospheric outside to the process chamber 1 via the transfer chamber 5, and returned to the atmospheric outside after the process.

An evacuation hole 102 is provided at the bottom wall of the process chamber 1. A pumping line 11 is connected with the evacuation hole 102. The pumping line 11 is capable of pumping the process chamber 1 at a required vacuum pressure ranging from $10^{-6}$ to $10^{-7}$ Torr. The pumping line 11 comprises a vacuum pump such as turbo-molecular pump or diffusion pump. A pumping speed controller (not shown) is provided on the pumping line 11.

A gas-introduction hole 103 is provided at the upper wall of the process chamber 1. A process-gas introduction line 2 is connected with the gas-introduction hole 103 for introducing a process gas into the process chamber 1. In this, embodiment, the process-gas introduction line 2 is capable of introducing gases of carbon tetra-fluoride (CF4), argon and oxygen. The process-gas introduction line 2 comprises each gas bomb (not shown) filled with each of these gases respectively, valves 22 and mass-flow controllers 23 provided on each of feeding pipes interconnecting the bombs and the process chamber 1.

The apparatus comprises a plasma generator to generate plasma P at a plasma generation region by applying energy to the introduced process gases. The plasma generator comprises an opposite electrode 31, and a plasma power source 32 to apply voltage to the opposite electrode 3, thereby generating the plasma P. In this embodiment, the opposite electrode 31 is commonly used as a route for the gas introduction. The opposite electrode 31 has a hollow structure where gas effusion holes 310 are provided at the bottom. The gases are introduced into the inside of the opposite electrode 31, therefrom effusing downward through the gas effusion holes 310.

The apparatus comprises a substrate holder 5 to hold the substrate 9 at a position where the substrate 9 is processed by the generated plasma. The opposite electrode 31 faces to the substrate holder 4 in the process chamber 1. The substrate holder 5 is a stage-like member. The substrate 9 is held on the top surface of the substrate holder 4. This surface is hereinafter called "holding surface". The substrate holder 4 comprises a metallic main body 41, and a dielectric block 42 fixed on the main body 41. The substrate holder 4 faces the opposite electrode in parallel, composing the so called parallel-plate structure.

Output power of the plasma power source 32 in this embodiment is 2 kW, and frequency is 60 MHz. RF voltage applied to the opposite electrode 31 by the plasma power source 32 ignites RF discharge between the opposite electrode 31 and the substrate holder 4, thereby energizing the introduced gases to shift in state of plasma. The plasma power source 32 is connected to the opposite electrode, interposing a matching element 321.

The apparatus comprises a temperature controller for controlling temperature of the substrate 9 as cools it. The temperature controller comprises a cooler 43. The cooler 43 circulates coolant through a cavity 40 inside the substrate holder 4. The cooler 43 comprises a coolant introduction pipe 431 to introduce the coolant into the cavity, a coolant drainage pipe 432 to drain the coolant out of the cavity 40, and a circulator 433 to re-cool the coolant and feed it back to the cavity 40.

For enhancing efficiency and accuracy of the temperature control by the cooler 43, the apparatus comprises a heat-exchange gas introduction line 5, which introduces a heat-exchange gas into the interface of the substrate 9 and the substrate holder 4. The surfaces of the substrate 9 and the substrate holder 4 are not completely flat but minutely rugged. Therefore, many minute spaces are formed at the interface. Heat exchange is poor in those spaces because of vacuum pressure. Considering this, the heat-exchange gas such as helium is introduced to increase pressure at the interface, thereby enhancing heat-exchange efficiency. The surface of the substrate holder has a concave 420 for providing a pressurized large area at the back of the substrate 9. The heat exchange gas is introduced into the concave 420.

Further for enhancing efficiency and accuracy of the temperature control by the cooler 43, the apparatus comprises an electrostatic chuck (ESC) 6. The ESC 6 comprises a chucking electrode 61 provided in the dielectric block 42, and a chucking power source 62 connected to the chucking electrode 61. Voltage applied to the chucking electrode 61 by the chucking power source 62 dielectrically polarizes the dielectric block 42 and induces static charges on the holding surface. As a result, the substrate 9 is electrostatically chucked on the holding surface. A filter circuit 63 is provided to prevent propagation of the RF wave to the chucking power source 62.

A bias power source 44 is connected with the substrate holder 4 for extracting ions from the plasma and making them incident onto the substrate 9. The bias power source 44 is an RF source where output power is 2 kW and frequency is 1.6 MHz. A matching element 441 is provided on the line from the bias power source 44 to the substrate holder 4. When RF voltage is applied to the substrate holder 4 by the bias power source 44 in state that the plasma is generated, self-biasing voltage is given to the substrate 9 through interaction of the RF wave and the plasma. The self-biasing voltage is the voltage that negatively biases the substrate 9. The self-biasing voltage extracts ions from the plasma and bombards the substrate 9 with them, thereby enhancing the etching efficiency or improving the etching property.

A correction ring 45 is provided surrounding the substrate 9 on the substrate holder 4. The correction ring 45 is to protect the surface of the dielectric block 42 and prevent the process non-uniformity at the periphery of the substrate 9. An insulation member 46 is provided to insulate the substrate holder 4 from the process chamber 1 kept at the ground potential. The substrate holder 4 is fitted air-tightly at the bottom of the process chamber 1, interposing the insulation member 46. Another insulation member 47 covers the side of the substrate holder 4.

One point characterizing this embodiment is in structure for confining the plasma to the plasma generation region. This point will be described in detail as follows.

As described, the plasma generation region is located between the substrate holder 4 and the opposite electrode 31 facing to each other. A couple of plasma shields 71, 72 are provided surrounding the plasma generation region. One shield 71 is mainly for the plasma confinement. This shield 71 is hereinafter called "main shield". The other shield 72 concurrently serves as a partition to divide the inside space of the process chamber 1. This shield 72 is hereinafter called "partition shield".

The main shield 71 is cylindrical as a whole. The substrate holder 4 and the opposite electrode 31 are disc shaped or cylindrical as well. Those are in coaxial to each other. The substrate 9 is held at the position in coaxial to them. The main shield 71 is fitted to the upper wall of the process chamber 1 at the upper part. The upper part of the main shield 71 penetrates air-tightly through the upper wall, and is grounded electrically.

The main shield 71 concurrently serves as a holder for the opposite electrode 31. The main shield 71 comprises a flange part protruding inward, on which the opposite electrode 31 is held. An insulation member 33 surrounds the opposite electrode 31, insulating the opposite electrode 31 from the main shield 71. The bottom of the main shield 71 is located a little below the holding surface of the substrate holder 4. In other words, the upper part of the substrate holder 4 is inserted to the main shield 71.

The partition shield 72 is tube-shaped, e.g. cylindrical or polygonal in cross section, and in coaxial to the main shield 71. The main shield 71 interconnects the upper wall and the bottom wall of the process chamber 1, containing the opposite electrode 31 and the substrate holder 4. The partition shield 72 has an evacuation hole 720 at the lower part. Outside the partition shield is an evacuation room 100. At the evacuation room 720, the process chamber 1 comprises a main valve 101. The pumping line 11 pumps the inside space of the partition shield 72 through the evacuation hole 720 and the evacuation room 100. The partition shield 72 comprises an opening (not shown) for transferring in and out the substrate 9. The surfaces of the main shield 71 and the partition shield 72 are of insulator. Concretely, main bodies of the shields 71, 72 are made of metal such aluminum, and coated with insulator such as alumite. This is to prevent inflow of charged particles that brings the plasma non-uniformity and the energy loss.

The apparatus of this embodiment comprises an electrode 8 for preventing the plasma diffusion. The electrode 8, hereinafter "diffusion prevention electrode ", is the one which collects electros diffusing toward an opening of either shield 71, 72 or electrons have diffused through an opening of either shield 71, 72. As described, a plasma shield of which surface is insulator, i.e., the insulation potential, can prevent the plasma density non-uniformity and the power loss. However, if the shield has an opening, the plasma is easy to perform the bipolar diffusion through the opening. In this embodiment, the bottom opening of the main shield 71 and the evacuation hole 720 of the partition shield 72 correspond to this.

Figure 2:
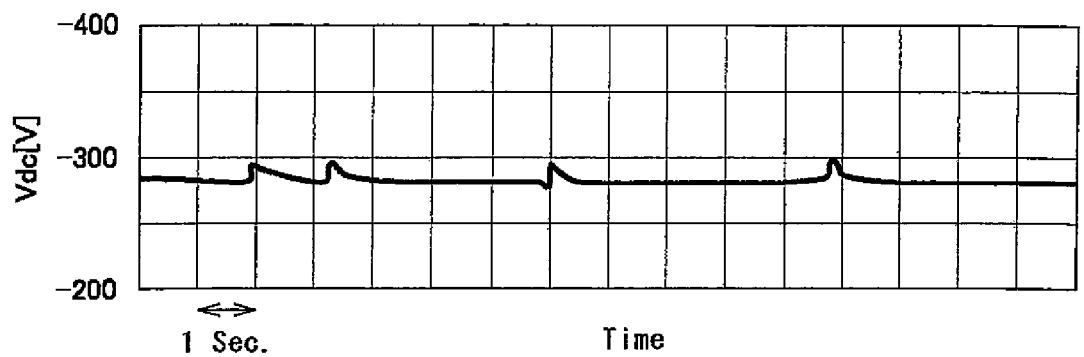
FIG. 2 shows the observed alternation of the self-biasing voltage in a span as short as several tens of minutes.
Figure 3:
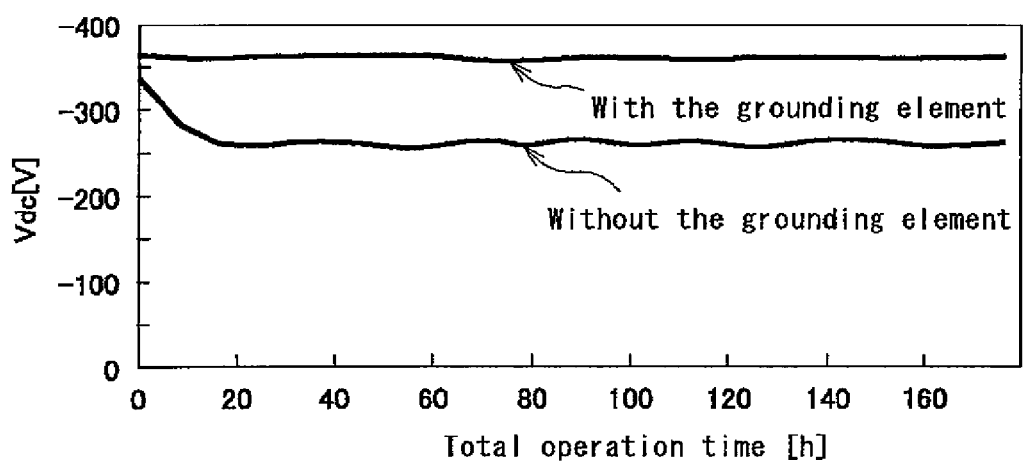
FIG. 3 shows the observed alternation of the self-biasing voltage in a long span up to two hundred hours.

From the research by the inventors, it has turned out that the plasma diffusion can be prevented by providing a conductor near the opening through which plasma might diffuse. Concretely, the inventors investigated the structure that the insulation coating was removed at the bottom end of the main shield 71 and the metallic main body was exposed. The exposed metallic body was connected to a metallic element for grounding (hereinafter "grounding element"). Then, it was recognized that the plasma diffusion through the evacuation hole 720 of the partition shield 72 was prevented. Result of the experiment in which this was recognized is shown in FIGS. 1-3.

The experiment was carried out the condition shown in Table 1.

TABLE 1

The condition of the experiment where the
diffusion prevention was recognized. SCCM stands
for " standard cubic centimeter per minute".

| Flow rates of | $C_4H_8$ | 22.5 |
| introduced gases | Ar | 500 |
| (SCCM) | $O_2$ | 10 |
| Plasma power source | | 60 MHz, 1.6 kW |
| Biasing power source | | 1.6 MHz, 1.8 kW |
| Chucking power source | | +100 V (dc) |
| Pressure in the convex 420 | | 30 Torr |

Two partition shields were prepared and alternately used in this experiment. Those were different in sizes of the evacuation holes. The hole of one was 1.5 mm in diameter, and the other one was 2.0 mm. As pressure in the process chamber was varied, it was confirmed whether the plasma could be confined in the partition shield. In addition, for investigating how the pumping character depends on size of the evacuation hole, ultimate pressure at a position adjacent to the substrate was measured as the pumping speed was kept constant.

TABLE 2

Pumping character depending on size of the
evacuation hole.

| Flow rates of | $C_4H_8$ | 22.5 |
| introduced gases | Ar | 500 |
| (SCCM) | $O_2$ | 10 |
| Plasma power source | | 60 MHz, 1.6 kW |
| Biasing power source | | 1.6 MHz, 1.8 kW |
| Chucking power source | | +100 V(dc) |
| Pressure in the convex 420 | | 30 Torr |

As shown in Table 2, without the grounding element, namely when the main shield 71 wholly covered by insulator was used, capable range of the plasma confinement was not more than 50 mTorr in case of the evacuation hole 720 of 1.5 mm in diameter, although ultimate pressure nearly at the substrate 9 was only 25 mTorr. In case of the evacuation hole 720 of 2.0 mm in diameter, capable range of the plasma confinement was further limited to 30 mTorr or less, although ultimate pressure nearly at the substrate decreased at 16 mTorr. Generally, when pressure increases, mean free path is reduced as well as width of plasma sheath is narrowed, resulting in that probability of ions to collide with neutral molecules increases. Therefore, plasma tends to diffuse easily through an opening, making the plasma confinement impossible.

With the grounding element, capable range of the plasma confinement was extended to 100 mTorr or more in case of the evacuation hole 720 of 1.5 mm in diameter. Even in case of the evacuation hole 720 of 2.0 mm, capable range of the plasma confinement was extended to 100 mTorr or more. This result clearly shows that the grounding element functions to extends the confinement capable range.

In the above-described experiment, temporal alternation of self-biasing voltage (Vdc) appearing at the opposite electrode 31 was measured for observing state of the plasma. The self-biasing voltage is the dc voltage that appears at the surface of a conductor adjacent to plasma when RF voltage is applied through capacitance to the conductor. Because of high mobility of electrons, potential at the surface of the conductor alters as negative dc voltage is superposed on the RF wave. This negative dc voltage is "self-biasing voltage". FIG. 2 shows the observed alternation of the self-biasing voltage in a span as short as several tens of minutes. FIG. 3 shows the observed alternation of the self-biasing voltage in a long span up to two hundred hours.

As shown in FIG. 2, the self-biasing voltage was stable at about −360 V in case with the grounding element. In case without the grounding element, contrarily, ripple-like rapid increases of the self-biasing voltage were frequently observed. The inventors recognized flashes of luminescence in the pumping room 100 at the moments of the ripple-like increases of the self-biasing voltage. Therefore, it is supposed that the ripple-like increases resulted from instantaneous diffusion of the plasma to the pumping room 100.

As shown in FIG. 3, in case with the grounding element, self-biasing voltage was stable during the operation time up to two hundred hours. However, in case without the grounding element, the self-biasing voltage tended to gradually decrease in the period of short operation time, then stabilizing at about −260 V after around twenty hours operation time. The reason of this supposedly resulted from leakage, i.e., diffusion, of the plasma through the evacuation hole 720. Concretely, this is supposedly resulted from film deposition accompanied by the plasma diffusion. Generally, plasma processing often accompanies film deposition. In the plasma etching using fluorocarbon gas, for example, a carbon polymerized film is deposited on the inner surface of a process chamber by species produced through decomposition of the gas in the plasma. While the total operation time is short, the evacuation hole 720 is wide enough for the plasma to diffuse, though the film is deposited on it. However, as the total operation time increases, the evacuation hole 720 is narrowed by the film deposition. As a result, the plasma diffusion through the evacuation hole 720 ceases, stabilizing the self-biasing voltage. The result in case without the grounding element shown in FIG. 3 supposedly demonstrates this phenomenon.

Anyway, such fluctuation of the self-biasing voltage means instability of the plasma, which deteriorates process reproducibility. The case with the grounding element is free from this problem, having stable capability of high process reproducibility. This advantage of the grounding element to prevent the plasma diffusion and make the plasma stable supposedly results from formation of a discharge circuit via the grounding element. Electrons staying on the insulator-made surface of the main shield 71 probably flow into the grounding element, reaching to the ground therefrom. Accordingly, even when electrons are excessively stored on the surface of the main shield 71, they may not overflow toward the partition shield 72. As a result, the plasma diffusion through the evacuation hole 720 on the partition shield 72 is prevented.

Figure 4:
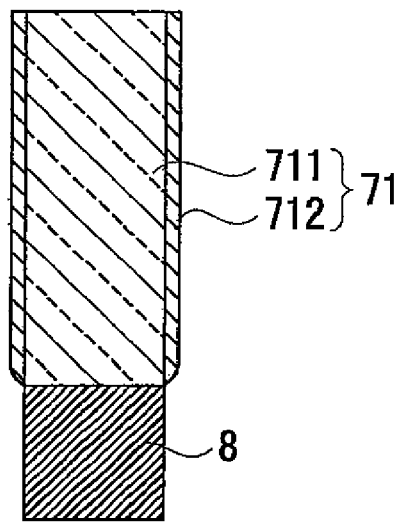
FIG. 4 shows a schematic cross-sectional view of the diffusion prevention electrode provided in the apparatus shown in FIG. 1.

In consideration of the above-described phenomenon, the apparatus of this embodiment comprises a diffusion prevention electrode 8 that corresponds to the grounding element. FIG. 4 shows a schematic cross-sectional view of the diffusion prevention electrode 8 provided in the apparatus shown in FIG. 1. In this embodiment, the diffusion prevention electrode 8 is provided at the bottom of the main shield 71. The diffusion prevention electrode 8 is circular-ring-shaped and the same in diameter as the main shield 71. The diffusion prevention electrode 8 is mounted on the main shield 71 by an easily-demountable way, e.g., screwing, clamping or the like.

As shown in FIG. 4, the main shield 71 comprises a metallic main body 711 and an insulation layer 712 covering the main body 711. The insulation layer 712 is provided by, for example, alumite treatment. The insulation layer does not cover the bottom end of the main shield 71, with which the diffusion prevention electrode 8 is shorted. The diffusion prevention electrode 8 is grounded because the main shield 71, exactly the main body 711, is grounded.

Location of the diffusion prevention electrode 8 is significant with respect to efficiency and homogeneity of the plasma processing. As described, the diffusion prevention electrode 8 is a port which electrons flow into. Therefore, if it is located close to the space between the opposite electrode 31 and the substrate holder 4, i.e., the plasma generation region, it much affects distribution of the plasma. If many electrons flow to the ground through the diffusion prevention electrode 8, the plasma density might decrease much at the periphery of the space. Otherwise, much of the input power might be wasted on the circuit from the diffusion prevention electrode 8 to the ground. Decrease of the plasma density at the periphery brings non-uniformity of the plasma processing. Waste of the input power means inefficiency of the plasma processing. As a solution for these problems, the diffusion prevention electrode 8 is preferably located at a position with a distance longer than the holding surface of the substrate holder 4 from the opposite electrode 31. As understood from FIG. 1, the apparatus satisfies this location.

Figure 5:
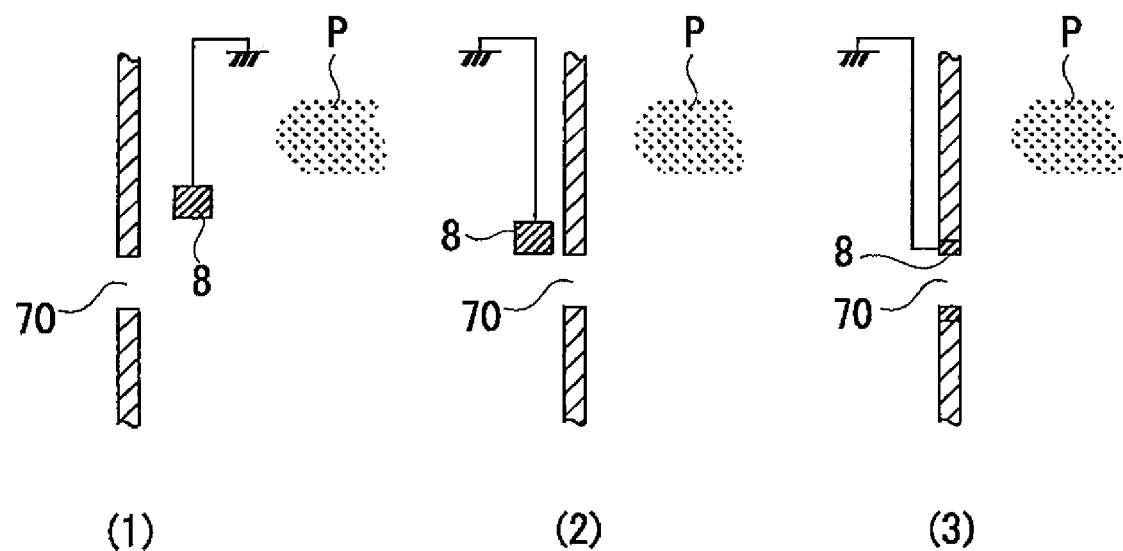
FIG. 5 explains location of the diffusion prevention electrode.

The diffusion prevention electrode is to prevent the plasma from diffusion through an opening of the plasma shield. Therefore, it is important that electrons diffusing toward the opening or having diffused through the opening can flow into the diffusion prevention electrode. This point will described using FIG. 5. FIG. 5 explains location of the diffusion prevention electrode.

In FIG. 5, an opening 70 exists apart from the region where plasma P is generated. As shown in FIG. 5(1), the diffusion prevention electrode 8 may be located on a route for electrons to diffuse from the plasma generation region to the opening 70. Otherwise, as shown in FIG. 5(2), the electrode 8 may be located nearly at the exit-side of the opening 70. In this case as well, diffusion of the plasma P is prevented because electrons do not diffuse far from the opening 70. Moreover, as shown in FIG. 5(3), the electrode 8 may be provided within the opening 70, for example, on the edge of the opening 70.

As described, the plasma processing in this embodiment accompanies deposition of a carbon polymer film. However, no carbon polymer film deposits on the partition shield 72, especially on the edge of the evacuation hole 720. If a thick film is deposited on the edge of the evacuation hole 720, it brings the problem of narrowness, i.e., decrease of the conductance. This embodiment is free from this problem as well. Depending on such parameters as pressure and input power, etching occasionally becomes dominant instead of film deposition. Even in this case, the partition shield 72 would not suffer the etching because the plasma diffusion to it is prevented.

The diffusion prevention electrode 8 in this embodiment is made of carbon. This is in consideration of that the electrode 8 may not produce any contaminant even when it is etched by the plasma. The apparatus of this embodiment carries out the plasma etching, using carbon fluoride gas. Therefore, carbon released from the etched electrode 8 does not matter particularly. Otherwise, the diffusion prevention electrode 8 may be made of silicon. In case the substrate 9 is made of silicon, the silicon-made electrode 8 would be no source of contaminants. The reason the diffusion prevention electrode 8 is easily demountable is because it needs to be replaced due to consumption as the process is repeated.

Figure 6:
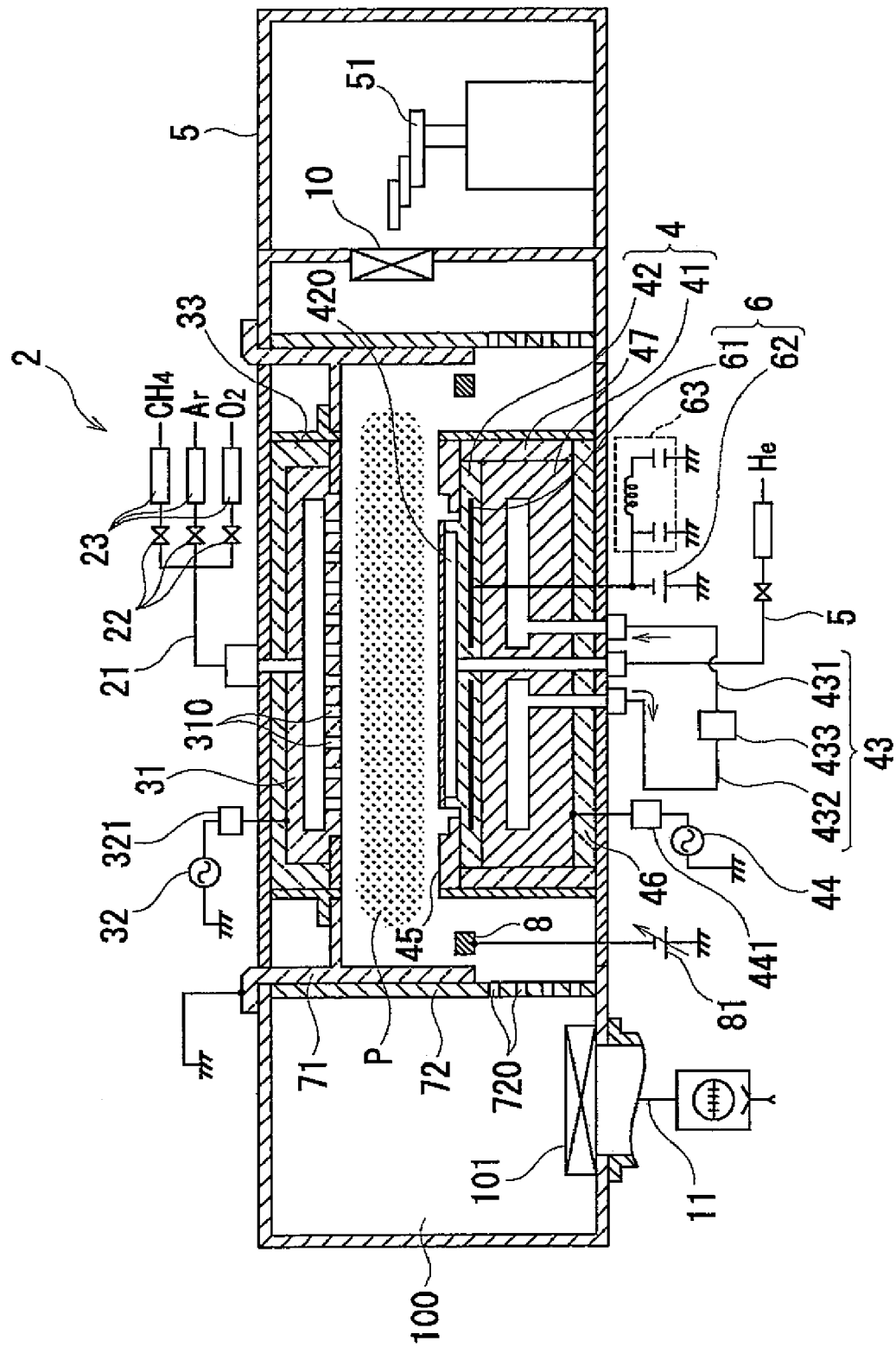
FIG. 6 is a schematic front cross-sectional view of the plasma processing apparatus of the second embodiment.

Following is description about the second embodiment of the invention. FIG. 6 is a schematic front cross-sectional view of the plasma processing apparatus of the second embodiment. As well as the first embodiment, the apparatus shown in FIG. 6 comprises a process chamber 1, a pumping line 11 for pumping the process chamber 1, a process-gas introduction line 2 for introducing a process gas into the process chamber 1, a plasma generator for generating plasma at a plasma generation region in the process chamber 1, and a substrate holder 5 for holding the substrate 9 in the process chamber 1.

In the embodiment shown in FIG. 6, a diffusion prevention electrode 8 is provided separately from the plasma shields 71, 72. Concretely, the electrode 8 is provided at the side of the substrate holder 4. The electrode 8 is ring-shaped, surrounding the substrate holder 4. Location of the electrode 8 is below the holding surface of the substrate holder 4, being with a distance longer than the holding surface from the opposite electrode 31.

As shown in FIG. 6, a diffusion prevention source 81 is connected to the electrode 8. The diffusion prevention source 81 is to apply voltage for the diffusion prevention to the electrode 8. In this embodiment, the source 81 applies negative dc voltage of about −20 V. When some negative dc voltage is applied to the diffusion prevention electrode 81, it functions to push back electrons in the plasma P. As a result, the bipolar diffusion of the plasma is prevented. If too much negative voltage is applied, it might attract many ions, resulting in promoting the bipolar diffusion instead of preventing. The voltage is preferably applied to the diffusion prevention electrode 8 as much as electrons remain near the electrode 2 and largeness of their mobility compared to ions is compensated.

In this embodiment, because the diffusion prevention electrode 8 is provided separately from the plasma shields 71, 72, it is designed with high flexibility. Still, the diffusion prevention electrode 8 may be a part of either shield 71, 72 or be mounted on either shield 71, 72. This case has the merit of structure simplification. The source 81 to apply voltage to the diffusion prevention electrode 8 is capable of optimizing the diffusion prevention function, according to process condition.

The diffusion prevention electrode 8 may be composed of multiple dice-shaped or ball-shaped members disposed with equal intervals on a circle in coaxial to the substrate holder 4. It is not always required to employ material of the electrode 8 that does not contaminate the process. Any other material can be employed in the case the electrode 8 is prevented from being etched, or in the case it is located at a position where no problem arises even if etched. The diffusion prevention electrode 8 may be made of high-melting-point metal such as tungsten. There may be the case that the diffusion prevention electrode 8 prevents plasma diffusion through the opening for transfer in and out of the substrate 9 or the bottom opening of the main shield 71.

The plasma power source 32 may be connected to the substrate holder 4 to apply electric field for the discharge via the substrate holder 4. Plasma processing carried out by the apparatus of the invention may be CVD, ashing, or surface treatment such as oxidation or nitriding, instead of the described plasma etching.

What is claimed is:

1. A plasma processing apparatus, comprising:
    a process chamber;
    a pumping line;
    a gas introduction line configured and positioned to introduce a gas into the process chamber;
    a substrate holder that is provided in the process chamber and comprises a top surface on which a substrate to be processed by plasma is held;
    an opposite electrode located higher than the substrate holder and facing the substrate holder,
    a plasma power source to apply voltage to the opposite electrode or the substrate holder to generate the plasma at a plasma generation region between the substrate holder and the opposite electrode;
    a plasma shield that surrounds the plasma generation region between the substrate holder and the opposite electrode to prevent the plasma from diffusing; and
    a surface of the plasma shield exposed to the plasma is made of electrically insulating material,
    the plasma shield interconnects an upper wall and a bottom wall of the process chamber to partition the process chamber, and an evacuation room to which the pumping line is connected is outside the plasma shield in the process chamber,
    the plasma shield has an evacuation opening,
    the evacuation opening provided in the plasma shield is located lower than the top surface of the substrate holder, and
    a diffusion prevention electrode, wherein
    the diffusion prevention electrode is located where electrons diffusing to or having diffused through the evacuation opening, to prevent the plasma from diffusing through the evacuation opening, and
    the diffusion prevention electrode is located lower than the top surface of the substrate holder on which the substrate is placed, and is located adjacent to or in the evacuation opening.

2. A plasma processing apparatus as claimed in claim 1, wherein the diffusion prevention electrode is grounded.

3. A plasma processing apparatus as claimed in claim 1, further comprising a power source connected to the diffusion prevention electrode to apply voltage.

4. A plasma processing apparatus as claimed in claim 1, wherein the diffusion prevention electrode releases material not producing contamination when etched.

5. A plasma processing apparatus as claimed in claim 4, wherein the gas is carbon fluoride, the substrate is etched by the plasma, and the diffusion prevention electrode is made of carbon.

6. A plasma processing apparatus as claimed in claim 4, wherein the substrate is made of silicon, and the diffusion prevention electrode is made of silicon.

7. A plasma processing apparatus, comprising:
    a process chamber;
    a pumping line;
    a gas introduction line configured and positioned to a gas into a plasma generation region in the process chamber;
    a plasma generator for generating plasma at the plasma generation region provided above a top surface of a substrate holder by applying energy to the introduced gas;
    the substrate holder is provided in the process chamber and the top surface of the substrate holder is provided to hold a substrate to be processed by the plasma;
    a plasma shield that surrounds the plasma generation region above the top surface of the substrate holder to prevent the plasma from diffusing;
    a diffusion prevention electrode; and
    a power source that applies voltage to the diffusion prevention electrode, wherein
    a surface of the plasma shield exposed to the plasma is made of electrically insulating material,
    the plasma shield has at least one opening, and
    the diffusion prevention electrode is located where electrons diffusing to or having diffused through the at least one opening flow in, to prevent the plasma from diffusing through the at least one opening.

8. A plasma processing apparatus as claimed in claim 7, wherein the diffusion prevention electrode releases material not producing contamination when etched.

9. A plasma processing apparatus as claimed in claim 8, wherein the gas is carbon fluoride, the substrate is etched by the plasma, and the diffusion prevention electrode is made of carbon.

10. A plasma processing apparatus as claimed in claim 8, wherein the substrate is made of silicon, and the diffusion prevention electrode is made of silicon.

* * * * *